United States Patent [19]

Kuroda et al.

[11] Patent Number: 4,475,044
[45] Date of Patent: Oct. 2, 1984

[54] APPARATUS FOR FOCUS-DEFLECTING A CHARGED PARTICLE BEAM

[75] Inventors: Katsuhiro Kuroda; Akira Fukuhara, both of Hachioji, Japan

[73] Assignee: Hitachi, Ltd., Tokyo, Japan

[21] Appl. No.: 140,960

[22] Filed: Apr. 17, 1980

[30] Foreign Application Priority Data

Apr. 23, 1979 [JP] Japan .......................... 54-53417[U]

[51] Int. Cl.³ .......................... H01J 3/14; G21K 1/08
[52] U.S. Cl. .............................. 250/396 ML; 250/311; 250/396; 250/396 R
[58] Field of Search ............... 250/396 ML, 396, 311

[56] References Cited

U.S. PATENT DOCUMENTS

| 3,872,305 | 3/1975 | Kaike | 250/311 |
| 3,924,126 | 12/1975 | Anderson et al. | 250/311 |
| 3,930,181 | 12/1975 | Pfeiffer | 250/396 ML |
| 4,110,622 | 8/1978 | Trotel | 250/396 ML |

Primary Examiner—Harold Dixon
Attorney, Agent, or Firm—Antonelli, Terry & Wands

[57] ABSTRACT

The apparatus for focus-deflecting a charged particle beam includes two electron lenses for focusing the charged particle beam and a single deflector for deflecting the charged particle beam to a desired position, wherein one of the electron lenses on the object point side and the deflector are arranged so that their magnetic fields overlap each other, and the aberration generated by them offsets that generated by the other of the electron lenses.

3 Claims, 2 Drawing Figures

APPARATUS FOR FOCUS-DEFLECTING A CHARGED PARTICLE BEAM

BACKGROUND OF THE INVENTION

This invention relates to an improvement in an apparatus for focus-deflecting a charged particle beam.

Focus-deflection systems for a charged particle beam have generally gained wide application in charged particle exposure systems, such as systems including an apparatus for electron-beam lithography, an electron-beam milling machine, a scanning type electron microscope, an ion implanter, an image pickup tube, and so forth.

One such focus deflection system for a charged particle beam is disclosed in Japanese Patent Publication No. 14495/1973 and includes first and second deflectors of the magnetic field type spaced along the path between the object point and the specimen surface and a magnetic field lens positioned coextensive with the second deflectors. With such an arrangement operation of the first deflector has the effect of shifting the lens in a direction transverse to the beam path to thereby reduce the deflection aberration. However, even with this arrangement, it is not possible to direct the charged particle beam so that it impinges perpendicularly on the specimen surface when the beam is deflected, and so, the deflection aberration cannot be entirely eliminated with such an arrangement.

The difficulties with the formerly-disclosed system appear to stem from the combined effect of the two deflectors which require rotational adjustment to obtain a minimum aberration. This leads to a further disadvantage in that complicated adjustment procedures are required in the prior system just to achieve what is in reality a less than completely satisfactory reduction in the deflection aberration.

It is therefore an object of the present invention to provide a focus-deflection system which avoids or eliminates these disadvantages which have heretofore been inherent in systems of this type.

SUMMARY OF THE INVENTION

With the background as described above, the present invention is directed to provision of an apparatus for focus-deflecting a charged particle beam which greatly reduces the deflection aberration without calling for the above-mentioned complicated adjustment procedures and permits the charged particle beam to be directed perpendicularly upon the surface of the specimen.

To accomplish the above-mentioned object, the apparatus of the present invention comprises two electron lenses for focusing the charged particle beam and one deflector for deflecting the charged particle beam to a desired position, wherein one of the electron lenses, which is situated on the object point side, and the deflector are arranged so that their magnetic fields overlap each other and the aberration generated by them and the aberration generated by the other of the electron lenses offset each other.

DETAILED DESCRIPTION OF THE PREFERRED EMBODIMENTS

Figure 1:
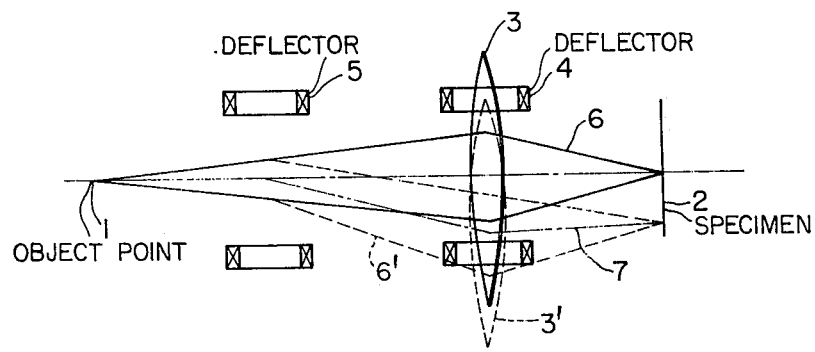
FIG. 1 is a schematic illustration useful for explaining the conventional focus-deflection system.

FIG. 1 shows an example of a focus-deflecting system of the type which may be used in charged particle exposure system such as described in Japanese Patent Publication No. 14495/1973. In this system, reference numeral 1 designates an object point from which the undeflected electron beam may pass along trajectory 6 through lens 3 to the specimen 2. A deflector 4 is disposed inside the lens 3, for example, of the magnetic field type, so that when a deflector 5 located upstream of the lens 3 is operated, the deflected electron beam 7 which passes along trajectory 6' responds to the deflector 4 as if the lens 3 were located at 3', thereby reducing the deflection aberration.

In this optical system, it is necessary to adjust the deflection excitation ratio and the angle of rotation between the deflectors 4 and 5 in order to reduce the deflection aberration. In this case, however, it is not possible to cause the charged particle beam to be incident perpendicularly upon the surface of a specimen 2. In other words, since the deflectors 4 and 5 are twisted with respect to one another during adjustment, the imaginary object point of the charged particle beam, as viewed only from the lens 3, does not fall on the optical axis, but departs from the same in accordance with the rotational relationships of the deflectors with the optical axis (or, without crossing the optical axis). In such a case, it is not possible to cause the charged particle beam to impinge perpendicularly upon the surface of the specimen 2 in the rotating direction, though it is possible in the radial direction.

Figure 2:
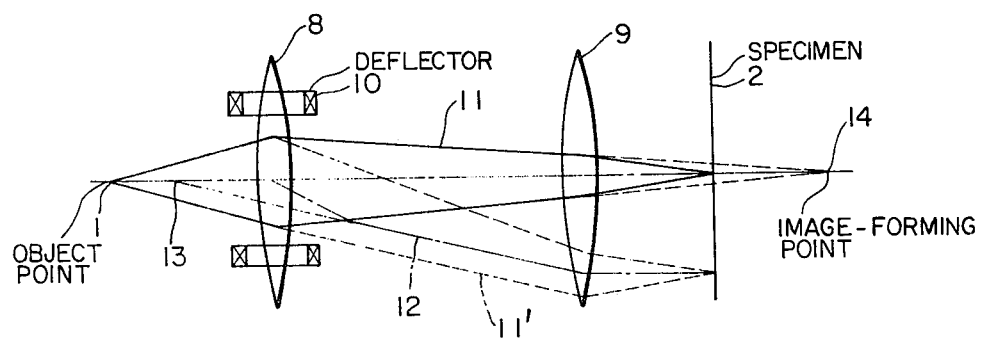
FIG. 2 is a schematic illustration of an embodiment of the present invention.

FIG. 2 shows the focus-deflection system of an embodiment in accordance with the present invention. First, a deflector 10 is positioned inside, or in the proximity of, a lens 8 on the object point side. In this instance, though the charged particle beam is deflected, it passes outside the axis of the lens 8 so that the deflection center of the beam is shifted by the action of the lens 8 to a point 13 on the object point side away from its original deflection center, thus establishing the charged particle trajectory 12. In this case, the deflection aberration becomes greater due to the action of the lens 8 and the deflector 10. It is possible, however, to reduce the deflection aberration on the surface of a specimen 2 by arranging lenses 8,9 and deflector 10 in such a manner that the deflection aberration due to the combined affect of the lens 8 and the deflector 10 and the off-axis aberration arising from the lens 9 offset each other. In this construction, the magnetic fields of the lenses 8 and 9 are set to oppose each other and the two lenses serve for focusing the charged particle beam on the specimen 2 which is disposed on the back side of the two lenses, the object point 1 being disposed on the front side of the two lenses.

Generally, a deflector has two-dimensional directivity in both the X- and Y-directions, but a lens does not have such directivity. Accordingly, in the system using two deflectors, as in the afore-mentioned focus-deflection system of FIG. 1, mutual adjustment of the two deflectors 4 and 5 in the X- and Y-directions is necessary to reduce aberration and such adjustment is extremely complicated. In the system of the present invention using only one deflector 10 and two lenses 8 and 9, however, there is no parameter which needs such direction adjustment. Hence, the adjustment can be made easily and the deflection aberration can be greatly reduced as a result.

It is also possible to direct the charged particle trajectory 12 to perpendicularly intercept the surface of the specimen 2, if the image-forming point 14 of the lens 8 is located on the opposite side of the surface of the specimen 2 from the lens 9 and if the point 13 is located on or close to a focal point of the lens 9 on the object point side.

In other words, the charged particle beam deflected by the lens 8 and the deflector 10 describes a trajectory 12 as if it were emitted from the point 13. This imaginary object point is always on the optical axis as only one deflector 10 is employed. Accordingly, if the construction is such that the point 13 is situated on or close to the focal point of the lens 9 on the object point side, the charged electron beam can be incident perpendicularly upon the surface of the specimen 2.

As described above, since the apparatus of the present invention uses only one deflector, the deflection aberration can be reduced through simple adjustment and the charged particle beam can be incident perpendicularly upon the surface of the specimen. In addition, the apparatus of the invention has another advantage in that even if the height of the specimen surface varies, changes in the position do not occur.

The afore-mentioned lenses and deflector in the present invention may be of a magnetic field type and an electrostatic type, respectively, or any type capable of carrying out the objects of this invention.

What is claimed is:

1. An apparatus for focus-deflecting a charged particle beam comprising two electron lenses for focusing the charged particle beam on a specimen disposed on the back side of said two electron lenses, and a single deflector for deflecting the charged particle beam to a desired position on the specimen, wherein one of said electron lenses is disposed on the object point side and is arranged in combination with said deflector so that their magnetic fields overlap each other, the other of said electron lenses being located between the combination of said one electron lens and said deflector and the specimen, said two electron lenses being of the magnetic field type and having magnetic fields thereof opposing each other, whereby the aberration generated by the combination of said one electron lens and said deflector offsets that generated by the other of said electron lenses.

2. The apparatus for focus-deflecting a charged particle beam as set forth in claim 1 wherein the image-forming point of said one electron lens is located on the opposite side of the surface of the specimen to the other of said electron lenses.

3. The apparatus for focus-deflecting a charged particle beam as set forth in claim 2, wherein said two electron lenses and said deflector are disposed so that the charged particle beam deflected to a desired position is directed perpendicularly upon the surface of the specimen.

* * * * *